United States Patent
Song

(10) Patent No.: US 10,732,219 B2
(45) Date of Patent: Aug. 4, 2020

(54) APPARATUS AND METHOD FOR TESTING SEMICONDUCTOR DEVICE AND SYSTEM COMPRISING THE SAME

(71) Applicant: Samsung Electronics Co., Ltd., Suwon-si (KR)

(72) Inventor: Ki Jae Song, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 290 days.

(21) Appl. No.: 15/660,275

(22) Filed: Jul. 26, 2017

(65) Prior Publication Data

US 2018/0100892 A1   Apr. 12, 2018

(30) Foreign Application Priority Data

Oct. 12, 2016  (KR) .......................... 10-2016-0132084

(51) Int. Cl.
   *G01R 31/28*   (2006.01)
   *G01R 31/26*   (2020.01)

(52) U.S. Cl.
   CPC ..... *G01R 31/2875* (2013.01); *G01R 31/2879* (2013.01); *G01R 31/2642* (2013.01)

(58) Field of Classification Search
   CPC ............ G01R 31/2875; G01R 31/2879; G01R 31/2642
   USPC ................................................... 324/750.05
   See application file for complete search history.

(56) References Cited

U.S. PATENT DOCUMENTS

| | | | | |
|---|---|---|---|---|
| 5,157,326 A | * | 10/1992 | Burnsides | G06F 11/24 324/537 |
| 5,966,021 A | * | 10/1999 | Eliashberg | G01R 31/2863 324/750.05 |
| 6,285,206 B1 | | 9/2001 | Higashide | |
| 6,777,969 B1 | * | 8/2004 | Davidson | G01R 31/2849 324/750.05 |
| 6,812,691 B2 | | 11/2004 | Miller | |

(Continued)

FOREIGN PATENT DOCUMENTS

| | | |
|---|---|---|
| EP | 1523686 | 4/2005 |
| EP | 1722247 | 11/2006 |

(Continued)

*Primary Examiner* — Melissa J Koval
*Assistant Examiner* — Rahul Maini
(74) *Attorney, Agent, or Firm* — Muir Patent Law, PLLC

(57) ABSTRACT

An apparatus for testing semiconductor devices and a system including the same includes a socket unit having a plurality of sockets into which a plurality of semiconductor devices are inserted, respectively. Also included is a module unit including a first sub-module for receiving a test signal from a host and providing the same test signal to each of the plurality of sockets, and a second sub-module including the same structure as the first sub-module. The first sub-module includes a first buffer unit including an amplifier having an input terminal to which an input signal is inputted and an output terminal to amplify and output the input signal inputted based on a reference voltage (VT), and a reference resistor having one end connected to the input terminal of the amplifier and the other end to which the reference voltage is applied, and a second buffer unit including the same structure as the first buffer unit.

20 Claims, 9 Drawing Sheets

(56) References Cited

U.S. PATENT DOCUMENTS

| | | | |
|---|---|---|---|
| 6,965,248 B2 | 11/2005 | Miller | |
| 7,290,529 B2 | 11/2007 | Suzuki et al. | |
| 7,345,495 B2 * | 3/2008 | Dangelo | G01R 31/2863 324/750.06 |
| 7,669,583 B2 | 3/2010 | Moriya | |
| 8,106,675 B2 | 1/2012 | Song et al. | |
| 8,310,265 B2 | 11/2012 | Zjajo et al. | |
| 9,379,029 B2 * | 6/2016 | Osanai | G01R 31/2863 |
| 2004/0178786 A1 * | 9/2004 | Yeh | G01R 31/2855 324/750.03 |
| 2017/0161523 A1 * | 6/2017 | Matsumoto | G06F 21/60 |

FOREIGN PATENT DOCUMENTS

| | | |
|---|---|---|
| JP | 2005-010069 | 1/2005 |
| JP | 2010-036471 | 2/2010 |
| JP | 2011-171666 | 9/2011 |
| KR | 0967147 | 1/2005 |
| WO | WO 2004-008162 | 1/2004 |

* cited by examiner

110

APPARATUS AND METHOD FOR TESTING SEMICONDUCTOR DEVICE AND SYSTEM COMPRISING THE SAME

CROSS-REFERENCE TO RELATED APPLICATION

This application claims priority from Korean Patent Application No. 10-2016-0132084 filed on Oct. 12, 2016 in the Korean Intellectual Property Office, and all the benefits accruing therefrom under 35 U.S.C. 119, the contents of which in its entirety are herein incorporated by reference.

BACKGROUND

1. Technical Field

The present disclosure relates to an apparatus for testing a semiconductor device and a system comprising the same.

2. Description of the Related Art

Generally, it is known that the probability of semiconductor device failure is highest within the initial 1000 hours, and thereafter the failure probability is substantially constant over the remaining lifetime of the semiconductor device.

In semiconductor device production, a burn-in test is conducted to detect a potential failure in semiconductor devices, which may occur after the semiconductor devices are shipped, by detecting an initial failure of the semiconductor devices more quickly than in a normal environment through an accelerated life test under more severe conditions (e.g., semiconductor devices are mounted on a burn-in board, designed for the characteristics of each semiconductor device tested, disposed within a chamber in which a constant temperature of 125° C. or more is maintained for a specific time period) rather than in a general usage environment (e.g., room temperature).

Then, after the burn-in test is completed, an operation test is performed on the semiconductor devices that have passed the burn-in test. The operation test refers to a test that is performed after the semiconductor devices are mounted on an application set (or mounting set). Accordingly, the burn-in test and the operation test are conducted separately in different apparatuses and it, therefore, takes a long time to test semiconductor devices.

More particularly, since the burn-in test is conducted in a burn-in system capable of performing function control at a significantly high temperature and the operation test is conducted using a new application set at a temperature lower than the temperature at which the burn-in test is conducted, the time required to move the semiconductor devices between the two different test apparatuses reduces test efficiency.

SUMMARY

Aspects of the present disclosure provide a single semiconductor device testing apparatus for simultaneously or sequentially performing a burn-in test and an operation test to reduce the time and costs consumed in testing semiconductor devices. More particularly, the single semiconductor device testing apparatus can perform both the burn-in test and the operation test for the semiconductor devices.

Aspects of the present disclosure also provide a single semiconductor device testing system for simultaneously or sequentially performing a burn-in test and an operation test to reduce the time and costs consumed in testing semiconductor devices.

In accordance with an aspect of the present disclosure, an apparatus for testing a semiconductor device includes a socket unit including a plurality of sockets into which a plurality of semiconductor devices are inserted, respectively, and a module unit including a first sub-module receiving a test signal from a host and providing the same test signal to each of the plurality of sockets, and a second sub-module including the same structure as the first sub-module, wherein the first sub-module includes a first buffer unit including an amplifier having an input terminal to which an input signal is inputted and an output terminal to amplify and output the input signal inputted based on a reference voltage (VT), and a reference resistor having one end connected to the input terminal of the amplifier and the other end to which the reference voltage is applied, and a second buffer unit including the same structure as the first buffer unit.

In accordance with another aspect of the present disclosure, a system for testing a semiconductor device includes a burn-in chamber capable of controlling a voltage magnitude of a test signal inputted from a host and an internal temperature, and a burn-in board installed in the burn-in chamber and receiving the test signal from the burn-in chamber, wherein the burn-in board includes a socket unit including a plurality of sockets into which a plurality of semiconductor devices are inserted, respectively, and a module unit connected to the plurality of sockets and providing the same test signal to the plurality of sockets, wherein the module unit includes a first buffer unit including an amplifier having an input terminal to which an input signal is inputted and an output terminal to amplify and output the input signal inputted based on a reference voltage (VT), and a reference resistor having one end connected to the input terminal of the amplifier and the other end to which the reference voltage is applied, and a second buffer unit including the same structure as the first buffer unit.

However, aspects of the present disclosure are not limited or restricted to the ones set forth herein. The above and other aspects of the present disclosure will become more apparent to those of ordinary skill in the art by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
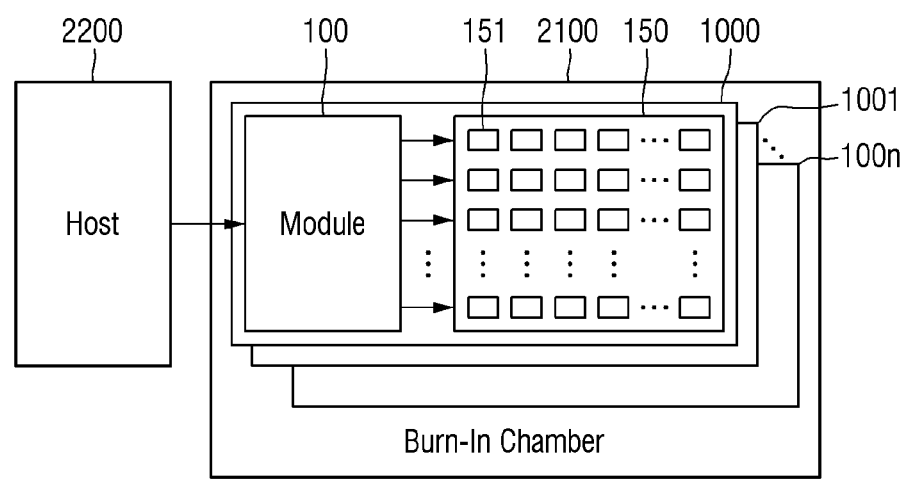
FIG. 1 is a block diagram illustrating a semiconductor device testing system according to exemplary embodiments of the present disclosure.

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that—examples—and many embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

A semiconductor device testing apparatus and a semiconductor device testing system of the present disclosure relate to burn-in test equipment for inspecting an initial failure of a semiconductor product, and more particularly, to a monitoring burn-in tester (MBT) of a burn-in board for checking an electric signal inputted to a semiconductor integrated circuit device completed through a semiconductor manufacturing process.

A burn-in test is a performance test conducted in a state in which semiconductor chips (e.g., memories) are packaged so as to function as a single component. Currently, most semiconductor chip manufacturers select, in advance, defective semiconductor chips generated in a process of artificially advancing a timing at which an initial failure occurs by applying a severe stress such as a high temperature or high voltage to the semiconductor chips, and perform an operation test on the semiconductor chips that have passed the burn-in test.

Here, the operation test refers to a test conducted after mounting semiconductor chips in an application set or a mounting set. That is, the burn-in test and the operation test are conducted separately in different apparatuses. Therefore, the semiconductor chip manufacturer requires a long time to test semiconductor chips, which increases product manufacturing time and cost.

In the semiconductor device testing apparatus and the semiconductor device testing system of the present disclosure, by simultaneously performing the burn-in test and the operation test using one apparatus, and improving signal integrity (SI) and power integrity (PI) of the burn-in board due to a multi-branch structure, it is possible to reduce the time consumed in testing semiconductor devices and reduce the cost consumed in testing the semiconductor devices.

Hereinafter, an apparatus for testing a semiconductor device and a system comprising the same according to exemplary embodiments of the present disclosure will be described with reference to FIGS. 1 to 9.

FIG. 1 is a block diagram illustrating a semiconductor device testing system according to exemplary embodiments of the present disclosure.

As shown in FIG. 1, the semiconductor device testing system of the present disclosure includes a burn-in chamber 2100 and a host 2200.

The burn-in chamber 2100 may be equipped with a plurality of burn-in boards 1001 to 100n (hereinafter, referred to as "BIB 1000"). The burn-in chamber 2100 can adjust the voltage magnitude of a test signal inputted from the host 2200 and adjust the temperature inside the burn-in chamber 2100. For example, in a burn-in test mode, the burn-in chamber 2100 can set the internal temperature to be higher than the room temperature.

Further, in the burn-in test mode in which a high temperature (e.g., higher than a room temperature, for example, 125° C. to 180° C. or greater) and/or a high voltage (e.g., higher than VOH, for example, 1.5V to 3V or 1.8V to 2.3V) is applied to the BIB 1000, the burn-in chamber 2100 may provide the test signal received from the host 2200 to the BIB 1000. In the burn-in test mode, the burn-in chamber 2100 of the present disclosure may perform an operation test on a plurality of semiconductor devices under test (DUTs) connected to sockets 151 of the BIB 1000 Then, the burn-in chamber 2100 may transmit an output value (e.g., "0" for pass or "1" for fail) for the test signal to the host 2200. In some examples, test signals, such as an address, data, a clock, and a command in the burn-in test mode may be provided to the burn-in chamber 2100 at a lower frequency than the provision of such test signals in the operation test. In some examples, such test signals in the burn-in test mode may have a higher voltage level than such test signals in the operation test.

The burn-in chamber 2100 can select defective semiconductor chips generated in a process of artificially advancing a timing at which an initial failure occurs by applying a severe stress such as a high temperature or a high voltage to the BIB 1000. Further, while this severe stress (e.g., at the high temperature) is applied to the BIB 1000, an operation test may be performed by transmitting a test signal to a plurality of DUTs connected to the sockets of the BIB 1000. For example, in the burn-in test mode, the high temperature and/or the high voltage of a power supply voltage and test signals, and a low frequency of the test signals may be applied to a plurality of DUTs, and in the operation test, the high temperature and/or the low voltage of the power supply voltage and the test signals, and a high frequency of the test signals may be applied to the plurality of DUTs. Thus, the burn-in chamber 2100 of the present disclosure can reduce the time and cost consumed in testing semiconductor devices.

The host 2200 may provide, to the burn-in chamber 2100, a test signal for testing a plurality of DUTs mounted on the BIB 1000 in the burn-in chamber 2100.

The BIB 1000 may include a module unit 100 and a socket unit 150. The socket unit 150 may include a plurality of sockets 151, to which a plurality of DUTs may be respectively mounted for testing. A DUT may be inserted into each of the sockets 151. Although not explicitly shown in the drawing, the socket unit 150 may include metal wirings for electrically connecting the plurality of sockets 151.

The module unit 100 may receive the test signal from the burn-in chamber 2100 and provide the same test signal to each of the plurality of sockets 151. In this case, the test signal may be a signal whose voltage is amplified by the burn-in chamber 2100, but the present disclosure is not limited thereto.

Figure 2:
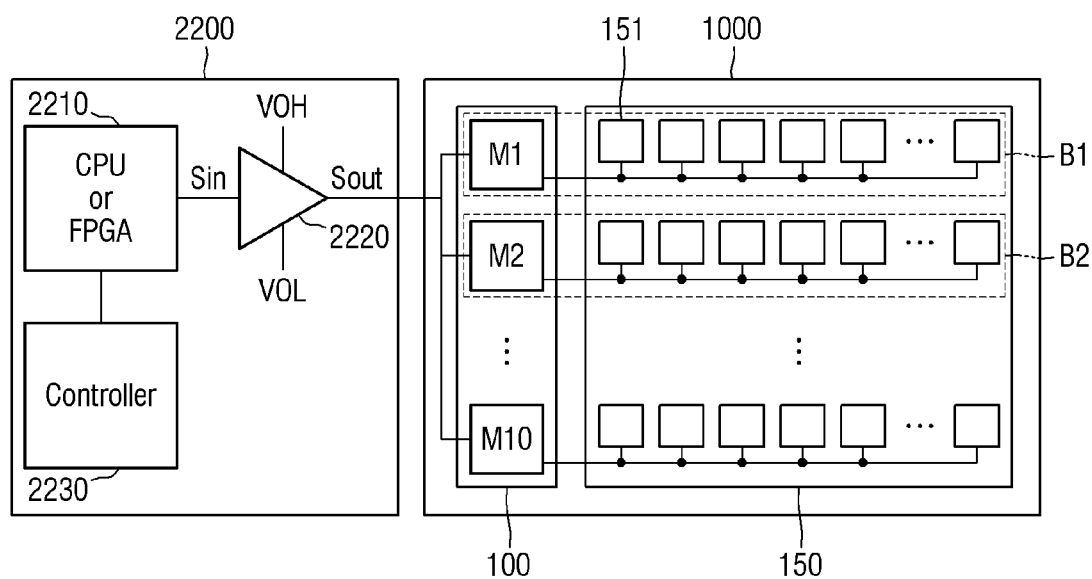
FIG. 2 is a diagram illustrating a semiconductor device testing system according to an embodiment of the present disclosure.

FIG. 2 is a diagram illustrating a semiconductor device testing system according to an embodiment of the present disclosure.

As shown in FIG. 2, a semiconductor device testing system according to an embodiment of the present disclosure includes the host 2200 and the BIB 1000.

The host 2200 includes a computing unit 2210, a signal output unit 2220, and a controller 2230.

The computing unit 2210 may include a central processing unit (CPU) or a field programmable gate array (FPGA) for processing commands. The FPGA is a semiconductor device that includes a programmable logic block and a programmable internal line. The programmable logic block can be programmed by replicating the functions of basic logic gates such as AND, OR, XOR and NOT, or a combination of more complex decoders or computational functions. The computing unit 2210 generates a test signal Sin and transmits it to the signal output unit 2220.

The test signal Sin may include an address, data, a clock, and a command, but the present disclosure is not limited thereto.

The signal output unit 2220 may convert the test signal received from the computing unit 2210 and transmit the converted test signal to the BIB 1000. For example, the signal output unit 2220 may convert the received test signal into a test signal having a voltage magnitude between VOH (i.e. high voltage) and VOL (i.e. low voltage) and provide the converted test signal to the BIB 1000. Further, although not explicitly shown in the drawing, the signal output unit 2220 may separately process an address, data, and a command included in the test signal Sin, and provide them to the BIB 1000.

The controller 2230 may control the operation of the computing unit 2210. For example, the controller 2230 may send an instruction to the computing unit 2210 to generate an appropriate test signal Sin, and control the computing unit 2210 to analyze the output value from the BIB 1000. However, the present disclosure is not limited thereto.

The BIB 1000 may include the module unit 100 and the socket unit 150.

The socket unit 150 may include a plurality of sockets 151. For example, the socket unit 150 may include a plurality of sockets 151 arranged in a grid shape of N×M. A DUT can be inserted into each socket.

The module unit 100 may include a plurality of sub-modules M1 to M10. For example, if the socket unit 150 is formed in a grid shape of N×M, the module unit 100 may include N sub-modules, or M sub-modules. Specifically, a first sub-module M1 may control a plurality of sockets arranged in a first row of the socket unit 150, and a second sub-module M2 may control a plurality of sockets arranged in a second row of the socket unit 150. In this case, the first sub-module M1 and the second sub-module M2 may receive the same test signal and may transmit the test signal to a plurality of sockets of the same number. However, the present disclosure is not limited thereto.

It has been illustrated in the drawing that a plurality of sockets arranged in each row are connected to one line, but the present disclosure is not limited thereto. A plurality of sockets arranged in the same row (for example, a first row) as a separate line may be connected to a sub-module (for example, M1).

The sub-modules M1 to M10 may have the same structure. Further, the sub-modules M1 to M10 may receive the same test signal and may transmit the test signal to a plurality of sockets. However, the present disclosure is not limited thereto.

Figure 3:
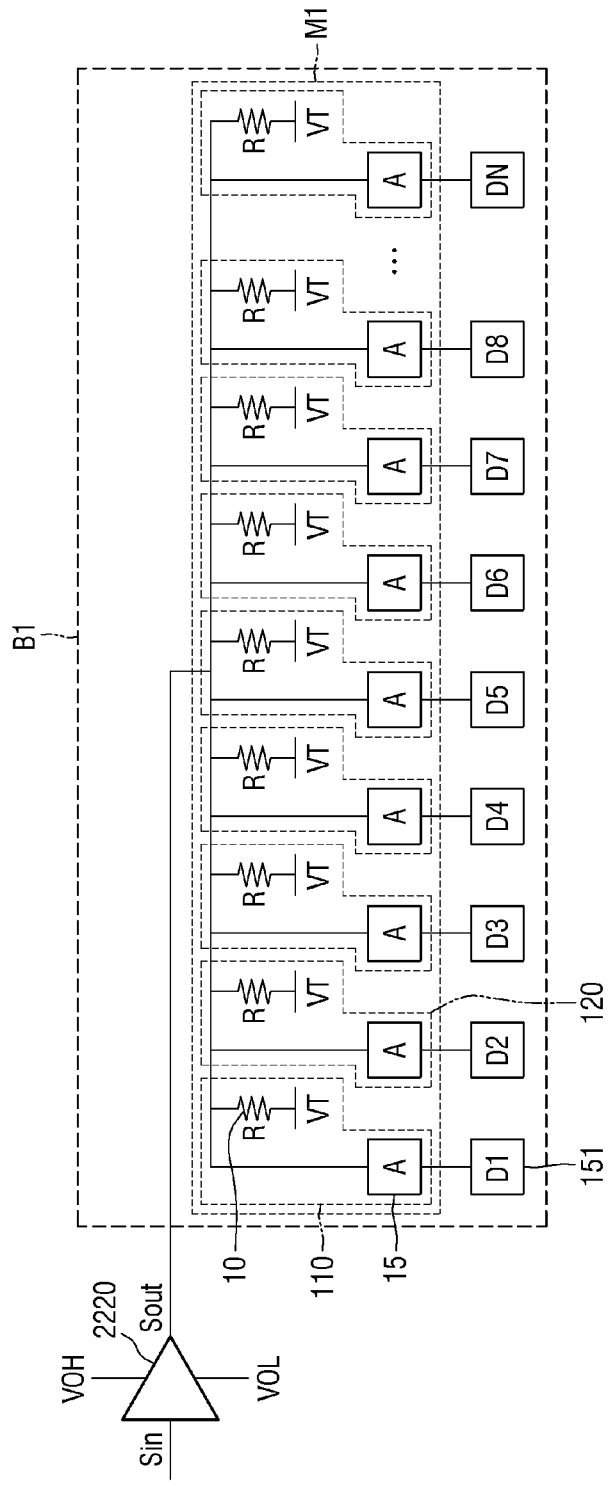
FIG. 3 is a block diagram illustrating a sub-module of a semiconductor device testing apparatus according to an embodiment of the present disclosure.
Figure 4:
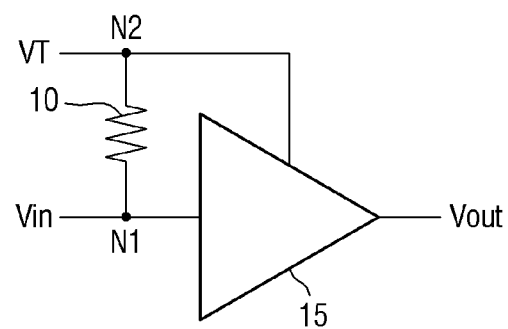
FIG. 4 is a circuit diagram illustrating a buffer unit of a semiconductor device testing apparatus according to an embodiment of the present disclosure.

FIG. 3 is a block diagram illustrating a sub-module of a semiconductor device testing apparatus according to an embodiment of the present disclosure. FIG. 4 is a circuit diagram illustrating a buffer unit of a semiconductor device testing apparatus according to an embodiment of the present disclosure.

FIG. 3 is a diagram for specifically explaining region B1 in FIG. 2. The first sub-module M1 of the semiconductor device testing apparatus according to an embodiment of the present disclosure includes a plurality of buffer units (for example, 110 and 120). The buffer units (for example, 110 and 120) may be one-to-one matched with the DUTs inserted into the sockets 151.

The first buffer unit 110 and the second buffer unit 120 may have the same structure. Further, the first buffer unit 110 and the second buffer unit 120 may receive the same test signal and may transmit the test signal to each of the sockets 151.

In this case, the first buffer unit 110 and the second buffer unit 120 may be connected to the same data bus so that they can receive the same test signal. Further, the first buffer unit 110 and the second buffer unit 120 may control the first socket and the second socket included in the same column or the same row of the socket unit 150, respectively. However, the present disclosure is not limited thereto. The following description will be given in conjunction with the first buffer unit 110.

The first buffer unit 110 may include a reference resistor 10 and an amplifier 15.

One end of the reference resistor 10 may be connected to an input terminal of the amplifier, and the other end of the reference resistor 10 may be applied with a reference voltage VT. The reference resistor 10 may reduce the magnitude of the test signal inputted through one end of the reference resistor 10 based on the reference voltage VT. Accordingly, it is possible to reduce the magnitude of the noise included in the test signal and to improve the signal integrity (SI) of the test signal inputted to the sockets 151.

The amplifier 15 may amplify the input signal inputted based on the reference voltage VT. The amplifier 15 may increase the magnitude of the test signal reduced by the reference resistor 10.

Although not explicitly shown in the drawing, an internal resistor or buffer may exist between the signal output unit 2220 of the host 2200 and a plurality of buffer units (for example, 110 and 120). That is, the test signal inputted from the signal output unit 2220 may pass through the internal resistor or buffer before being branched to a plurality of buffer units (for example, 110 and 120). However, the present disclosure is not limited thereto.

The BIB 1000 has a multi-branch structure of transmitting the same test signal to a plurality of sockets. Accordingly, the signal integrity (SI) can deteriorate as the speed of the test signal increases. The deterioration of the signal integrity (SI) may occur as the reflected wave increases due to the multi-branch structure of distributing the test signal to a plurality of sockets.

Therefore, the module unit 100 of the present disclosure can provide the test signal having improved signal integrity (SI) for each of the sockets 151 using a plurality of buffer units (for example, 110 and 120).

As shown in FIG. 4, the first buffer unit 110 may include the reference resistor 10 and the amplifier 15.

The amplifier 15 is disposed between an input terminal Vin and an output terminal Vout, and the reference voltage VT is applied to the amplifier 15. The reference resistor 10 is disposed between the input terminal Vin of the amplifier 15 and a node N2 to which the reference voltage VT is applied.

The reference resistor 10 may reduce the magnitude of the test signal inputted through the input terminal Vin based on the reference voltage VT. The amplifier 15 may amplify the magnitude of the reduced test signal based on the reference voltage VT.

Figure 5:
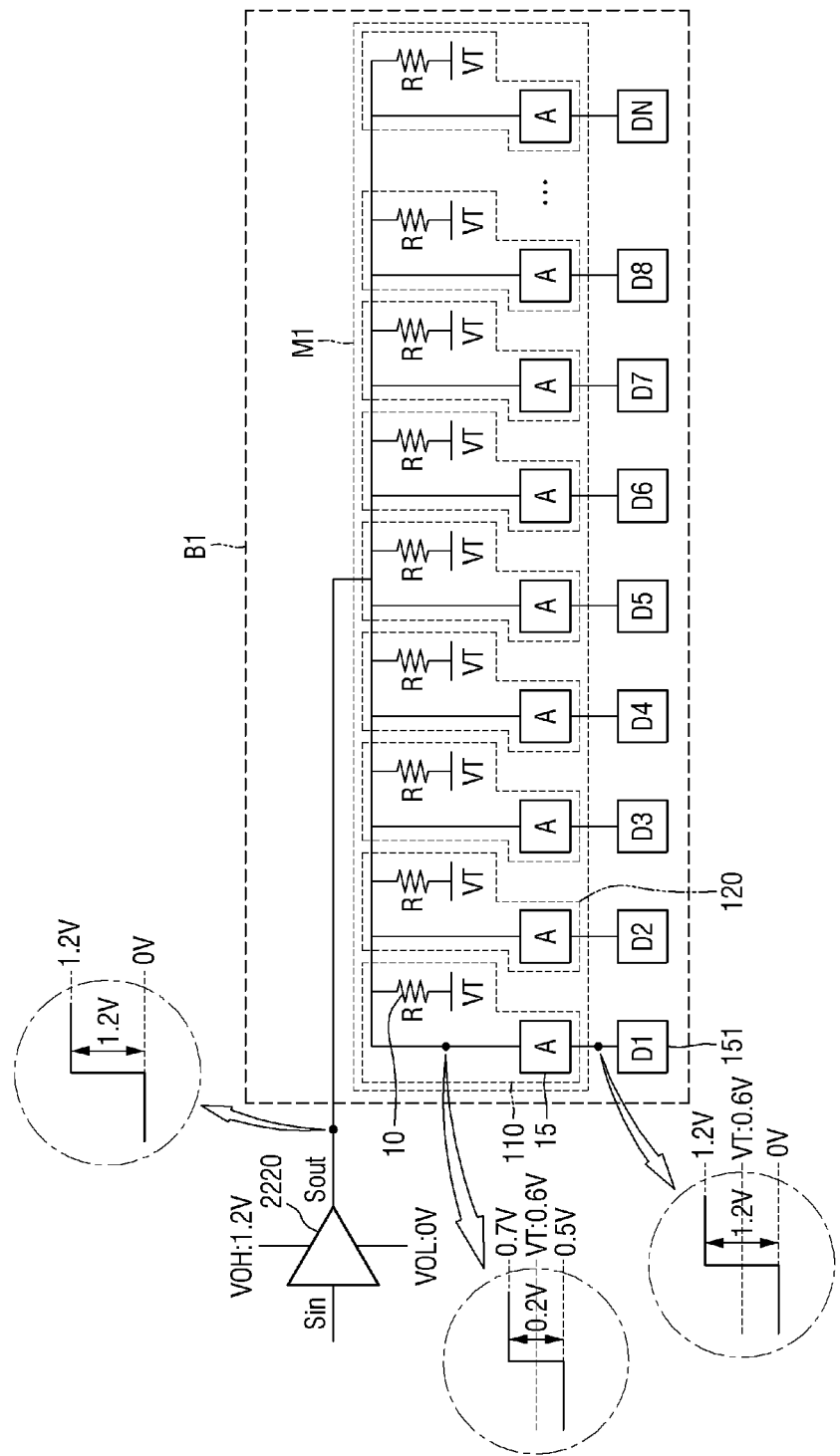
FIG. 5 is a block diagram for explaining an operation of a semiconductor device testing apparatus according to an embodiment of the present disclosure.

FIG. 5 is a block diagram for explaining an operation of a semiconductor device testing apparatus according to an embodiment of the present disclosure.

The operation of the semiconductor device testing apparatus according to an embodiment of the present disclosure will be described with reference to FIG. 5. The magnitude of the test signal applied to the BIB 1000 from the host 2200 may have VOH of 1.2 V and VOL of 0 V.

Then, the test signal may be applied to the input terminal of the first buffer unit 110 of the module unit 100. As the reference voltage VT of 0.6 V is applied to one end of the reference resistor 10 and the test signal is applied to the other end of the reference resistor 10, the magnitude of the test signal is reduced based on the reference voltage VT of 0.6 V. For example, the magnitude of the reduced test signal may be 0.5 V to 0.7 V.

Then, the amplifier 15 can amplify the magnitude of the reduced test signal from 1.2 V to 0 V. Accordingly, the module unit 100 of the present disclosure can reduce the magnitude of the noise included in the test signal and improve the signal integrity (SI) of the test signal inputted to the sockets 151.

Figure 6:
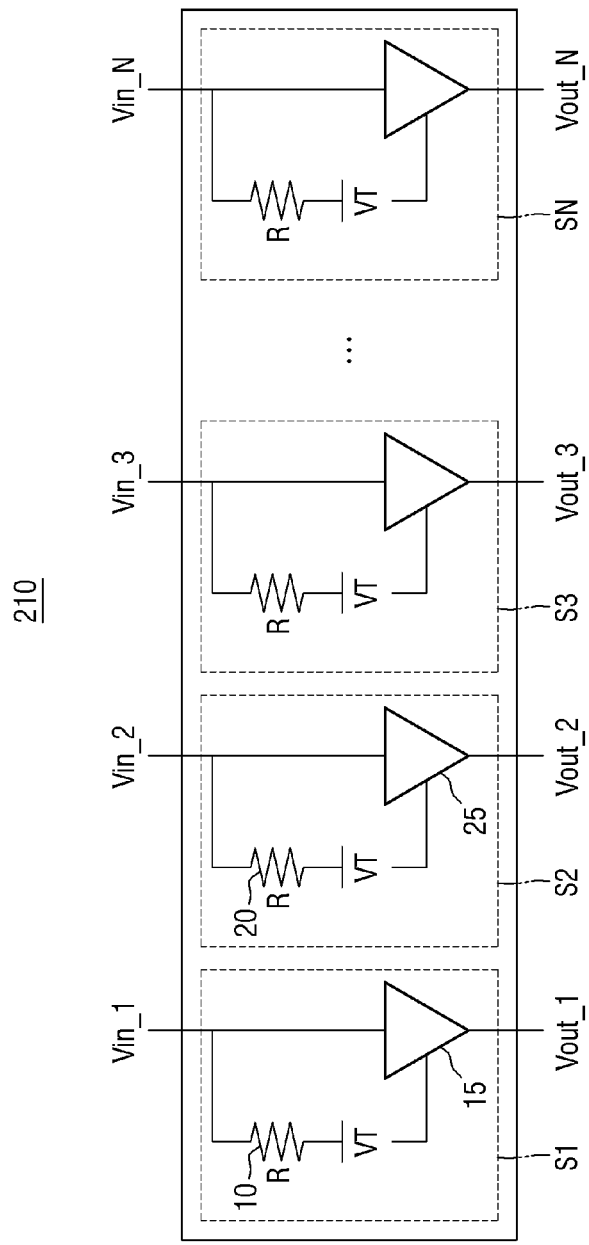
FIG. 6 is a block diagram illustrating a buffer unit of a semiconductor device testing apparatus according to another embodiment of the present disclosure.

FIG. 6 is a block diagram illustrating a buffer unit of a semiconductor device testing apparatus according to another embodiment of the present disclosure. The following description will mainly focus on differences and a redundant description will be omitted.

As shown in FIG. 6, a buffer unit 210 of a semiconductor device testing apparatus according to another embodiment of the present disclosure may include a plurality of sub-buffers S1 to SN. Although not explicitly shown in the drawing, the buffer unit 210 may be connected to one socket.

Each of the sub-buffers S1 to SN may be formed in substantially the same manner as the first buffer unit 110 described above. That is, each of the sub-buffers S1 to SN can improve the signal integrity (SI) of the input signal.

In this case, different signals (for example, Vin_1 to Vin_N) may be applied to the sub-buffers S1 to SN, respectively. For example, the test signals applied to the first sub-buffer S1 and the second sub-buffer S2 may be different from each other. For example, an address of a test signal may be applied to the first sub-buffer S1, and data of a test signal may be applied to the second sub-buffer S2. However, the present disclosure is not limited thereto.

In this case, the first sub-buffer S1 and the second sub-buffer S2 may provide respective output signals to the same socket in the socket unit 150. Accordingly, it is possible to extend the bandwidth required for the test signal applied to the sockets 151 of the socket unit 150 and to transmit a plurality of data required for the operation test to the DUTs.

Figure 7:
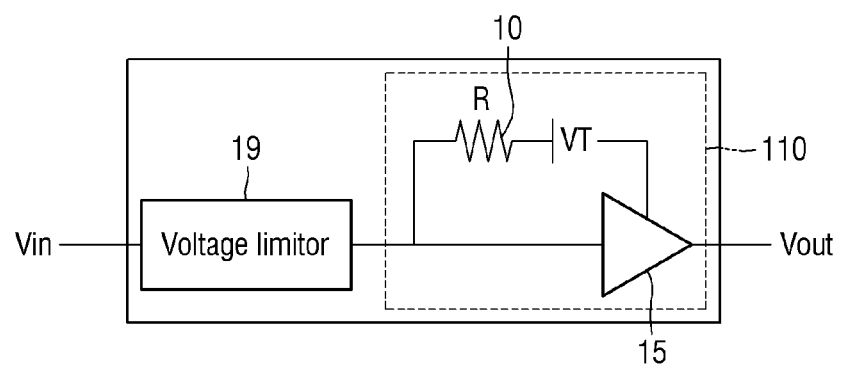
FIG. 7 is a block diagram illustrating a buffer unit of a semiconductor device testing apparatus according to still another embodiment of the present disclosure.
Figure 8:
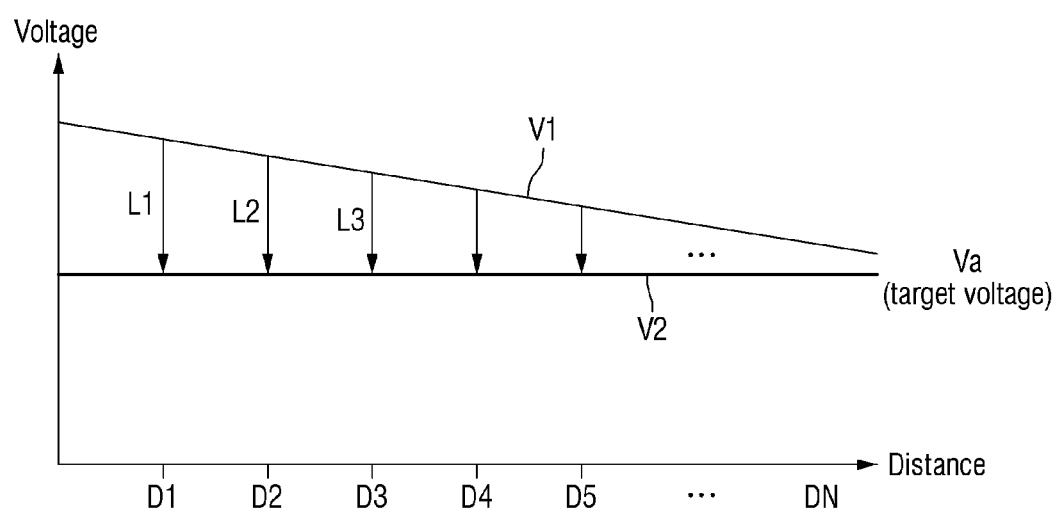
FIG. 8 is a graph for explaining an operation of the semiconductor device testing apparatus according to still another embodiment of the present disclosure.

FIG. 7 is a block diagram illustrating a buffer unit of a semiconductor device testing apparatus according to still another embodiment of the present disclosure. FIG. 8 is a graph for explaining an operation of the semiconductor device testing apparatus according to still another embodiment of the present disclosure. The following description will mainly focus on differences and a redundant description will be omitted.

As shown in FIG. 7, a buffer unit 310 of a semiconductor device testing apparatus according to still another embodiment of the present disclosure may include the reference resistor 10, the amplifier 15, and a voltage limiter 19. Here, the structure and function of the reference resistor 10 and the amplifier 15 are substantially the same as those of the buffer unit 110 described with reference to FIG. 4.

The voltage limiter 19 may convert the magnitude of the input signal into a predetermined magnitude and output the signal with the converted magnitude. For example, the voltage limiter 19 may receive the test signal from the host 2200, reduce the voltage of the test signal to a predetermined target voltage Va, and provide it to the input terminal of the amplifier 15.

As shown in FIG. 8, an X axis in the graph of FIG. 8 represents a distance between the module unit 100 that transmits the test signal and the socket 151, and a Y axis in the graph of FIG. 8 represents a maximum voltage inputted to the socket 151.

Since the BIB 1000 is formed to be elongated in a grid shape and the module unit 100 is disposed on one side of the BIB 1000, the maximum magnitude of the voltage inputted to the socket 151 may vary as the distance from the module unit 100 to the socket 151 increases. This is because as the wiring becomes longer, the resistance of the wiring increases. For example, the magnitude of the voltage inputted to the socket located at a first distance D1 and the magnitude of the voltage inputted to the socket located at a second distance D2 may be different from each other.

In order to solve this problem, the buffer unit 310 connected to each of the sockets 151 includes the voltage limiter 19, and each voltage limiter 19 outputs the voltage Va with the same predetermined magnitude.

For example, a voltage drop L1 of a first voltage limiter for the socket located at the first distance D1 may be different from a voltage drop L2 of a second voltage limiter for the socket located at the second distance D2. However, the output voltage Va of the first voltage limiter for the socket located at the first distance D1 is the same as the output voltage Va of the second voltage limiter for the socket located at the second distance D2.

Thus, it is possible to provide a uniform voltage to a plurality of DUTs, so that power integrity (PI) of the BIB 1000 of the present disclosure can be improved.

Subsequently, the reference resistor 10 and the amplifier 15 connected to the voltage limiter 19 may receive the output of the voltage limiter 19 and provide the signal with improved signal integrity (SI) to each of the sockets 151.

Figure 9:
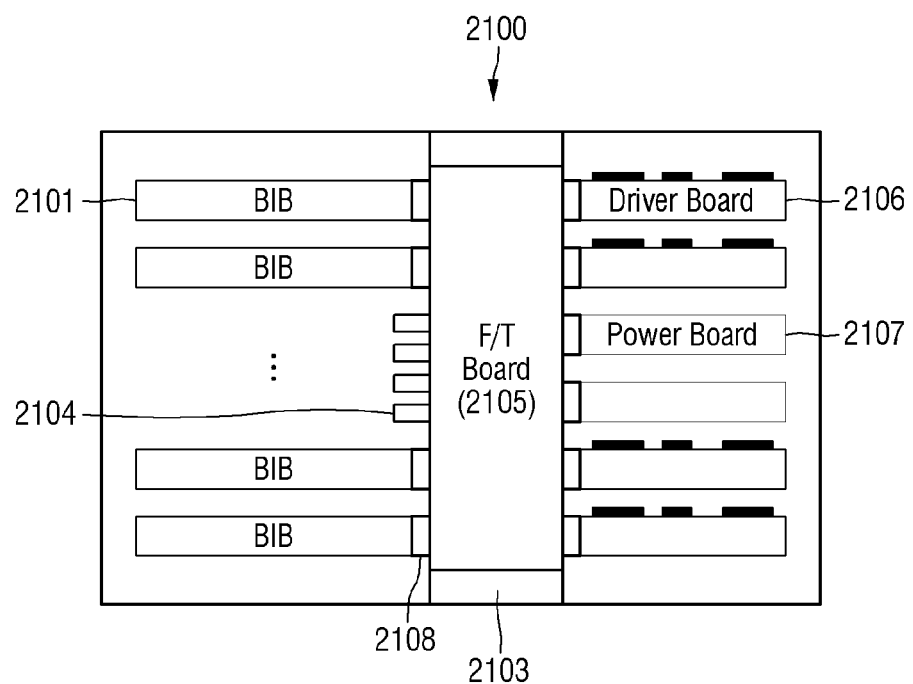
FIG. 9 is a diagram illustrating a semiconductor device testing system according to exemplary embodiments of the present disclosure.

FIG. 9 is a diagram illustrating a semiconductor device testing system according to exemplary embodiments of the present disclosure.

As shown in FIG. 9, a semiconductor device testing system according to exemplary embodiments of the present disclosure includes the burn-in chamber 2100. The inner space of the burn-in chamber 2100 is divided by a partition wall portion 2103 provided with a connection board (F/T board) 2105.

A plurality of connection portions 2108 are provided on one side of the connection board (F/T board) 2105, and a burn-in board 2101, into which a plurality of DUTs are inserted, may be mounted on each of the connection portions 2108. In this case, the burn-in board 2101 may be substantially the same as the BIB 1000 described above with reference to FIGS. 1 to 8.

A driver board 2106, on which driving devices are mounted, and a power board 2107 may be connected to the other side of the connection board (F/T board) 2105.

The host 2200 described with reference to FIGS. 1 and 2 may exist outside the burn-in chamber 2100, but the present disclosure is not limited thereto. The driver board 2106 and the power board 2107 may perform the functions of the host 2200 described above.

A plurality of air inlet ports 2104, through which air having a temperature of, e.g., 125° C. or higher is injected, may be installed in a space where the burn-in board 2101 is installed on the connection board (F/T board) 2105. However, the present disclosure is not limited thereto.

The burn-in chamber 2100 can select defective semiconductor chips generated in a process of artificially advancing a timing at which an initial failure occurs by applying a severe stress such as a high temperature or a high voltage to the burn-in board 2101. Further, while this severe stress is applied to the burn-in board 2101, an operation test may be performed on a plurality of DUTs by transmitting a test signal to the DUTs connected to a plurality of sockets of the burn-in board 2101. Thus, the burn-in chamber 2100 of the present disclosure can reduce the time consumed in testing semiconductor devices and also reduce the cost consumed in testing the semiconductor devices.

The embodiments of the present disclosure have been described with reference to the attached drawings, but it may be understood by one of ordinary skill in the art that the present disclosure may be performed one of ordinary skill in the art in other specific forms without changing the technical concept or essential features of the present disclosure. Further, the above-described embodiments are merely examples and do not limit the scope of the rights of the present disclosure.

What is claimed is:

1. An apparatus for testing a semiconductor device, comprising:
   a socket unit of a burn-in board, the socket unit comprising a plurality of sockets into which a plurality of semiconductor devices are, respectively, inserted; and
   a module unit comprising a first sub-module connected to a first portion of the plurality of sockets of the socket unit, said first sub-module configured to receive a test signal from a host and provide the same test signal to each one of said first portion of the plurality of sockets, and a second sub-module connected to a second portion of the plurality of sockets of the socket unit, said second sub-module configured to receive the test signal from the host and provide the test signal to each one of said second portion of the plurality of sockets,
   wherein the first sub-module comprises:
      a first buffer unit comprising an amplifier having an input terminal to which an input signal is inputted and an output terminal configured to amplify and output the input signal inputted based on a reference voltage (VT), and a reference resistor having one end connected to the input terminal of the amplifier and the other end to which the reference voltage is applied; and
      a second buffer unit comprising the same structure as the first buffer unit.

2. The apparatus of claim 1, wherein the first buffer unit comprises a first sub-buffer including the amplifier and the reference resistor, and a second sub-buffer having the same structure as the first sub-buffer and receiving a test signal different from the first sub-buffer.

3. The apparatus of claim 2, wherein the first sub-buffer and the second sub-buffer provide respective output signals to the same socket in the socket unit.

4. The apparatus of claim 2, wherein the first buffer unit further comprises a first voltage limiter configured to receive the test signal from the host, reduce a voltage magnitude of the test signal to a predetermined magnitude, and provide the test signal having the reduced voltage magnitude to the input terminal of the amplifier.

5. The apparatus of claim 4, wherein the second buffer unit further comprises a second voltage limiter operating in the same manner as the first voltage limiter of the first buffer unit, and
a voltage drop of the second voltage limiter is different from a voltage drop of the first voltage limiter.

6. The apparatus of claim 4, wherein a magnitude of an output voltage of the first voltage limiter is the same as a magnitude of an output voltage of a second voltage limiter configured to receive the test signal from the host, reduce a voltage magnitude of the test signal to a predetermined magnitude, and provide the test signal having the reduced voltage magnitude to the input terminal of the amplifier.

7. The apparatus of claim 1, wherein the first buffer unit and the second buffer unit are connected to the same data bus, and receive the same test signal.

8. The apparatus of claim 1, wherein the first buffer unit and the second buffer unit respectively control a first socket and a second socket comprised in the same column or the same row of the socket unit.

9. The apparatus of claim 1, wherein the first sub-module controls a plurality of sockets arranged in a first row of the socket unit, and
the second sub-module controls a plurality of sockets arranged in a second row of the socket unit.

10. The apparatus of claim 9, wherein the first sub-module and the second sub-module receive the same test signal and transmit the test signal to a plurality of sockets of the same number.

11. A system for testing a semiconductor device, comprising:
a burn-in chamber configured to control a voltage magnitude of a test signal inputted from a host and an internal temperature; and
a burn-in board installed in the burn-in chamber and configured to receive the test signal from the burn-in chamber,
wherein the burn-in board comprises:
a socket unit comprising a plurality of sockets into which a plurality of semiconductor devices are, respectively, inserted, the plurality of sockets being provided in rows and columns; and
a module unit connected to the plurality of sockets and configured to provide the same test signal to the plurality of sockets of the socket unit,
wherein the module unit comprises:
a first buffer unit connected to a first socket of the plurality of sockets and comprising an amplifier having an input terminal to which an input signal is inputted and an output terminal configured to amplify the input signal inputted based on a reference voltage (VT) and output the amplified input signal as the test signal, and a reference resistor having one end connected to the input terminal of the amplifier and the other end to which the reference voltage is applied; and
a second buffer unit connected to a second socket of the plurality of sockets and comprising the same structure as the first buffer unit.

12. The system of claim 11, wherein the burn-in chamber comprises a plurality of slots, each of which can be coupled to each of a plurality of burn-in boards.

13. The system of claim 12, wherein the burn-in chamber, in a burn-in test mode in which an internal temperature is set to be higher than a room temperature, is configured to provide the test signal to the plurality of burn-in boards, and transmit an output value for the test signal to the host.

14. The system of claim 11, wherein the first buffer unit comprises a first sub-buffer comprising the amplifier and the reference resistor, and a second sub-buffer having the same structure as the first sub-buffer and receiving a test signal different from the first sub-buffer.

15. The system of claim 11, wherein the first buffer unit further comprises a first voltage limiter configured to receive the test signal from the host, reduce a voltage magnitude of the test signal to a predetermined magnitude, and provide the test signal having the reduced voltage magnitude to the input terminal of the amplifier.

16. An apparatus for conducting multiple tests on a plurality of semiconductor devices, comprising:
a burn-in chamber which maintains equally a voltage level of a test signal received from a host and a temperature throughout the burn-in chamber and comprising a plurality of burn-in boards for receiving the plurality of semiconductor devices for testing;
each of said burn-in boards comprising a socket unit comprising a plurality of sockets into which the plurality of semiconductor devices are, respectively, inserted, and a module unit comprising a first sub-module configured to receive the test signal from the host and provide the same test signal to each one of a first portion of the plurality of sockets of the socket unit, and a second sub-module configured to receive the test signal from the host and provide the same test signal to each one of a second portion of the plurality of sockets of the socket unit,
wherein the first sub-module comprises:
a first buffer unit comprising an amplifier having an input terminal to which an input signal is inputted and an output terminal configured to amplify and output the input signal inputted based on a reference voltage (VT), and a reference resistor having one end connected to the input terminal of the amplifier and the other end to which the reference voltage is applied; and
a second buffer unit comprising the same structure as the first buffer unit,
wherein the multiple tests include a burn-in test conducted by applying severe stress of at least one of a high temperature test signal and a high voltage test signal to the plurality of semiconductor devices inserted into the plurality of sockets, and an operation test conducted by applying a test signal having a lower voltage than the high voltage test signal to the plurality of semiconductor devices inserted into the plurality of sockets.

17. The apparatus of claim 16,
wherein the first sub-module controls the first portion of the plurality of sockets, which are arranged in a first row of the socket unit, and
the second sub-module controls the second portion of the plurality of sockets, which are arranged in a second row of the socket unit.

18. The apparatus of claim 17,
wherein the first sub-module and the second sub-module are configured to receive the same test signal and transmit the test signal to the first portion of the plurality of sockets and the second portion of the plurality of sockets, and wherein the first portion of the plurality of sockets and the second portion of the plurality of sockets each comprise the same number of sockets.

19. The apparatus of claim 16, wherein the first buffer unit comprises:
   a first sub-buffer comprising the amplifier and the reference resistor, and
   a second sub-buffer having the same structure as the first sub-buffer and receiving a test signal different from the first sub-buffer.

20. The apparatus of claim 16, wherein the first buffer unit further comprises a first voltage limiter configured to receive the test signal from the host, reduce a voltage magnitude of the test signal to a predetermined magnitude, and provide the test signal having the reduced voltage magnitude to the input terminal of the amplifier.

* * * * *